United States Patent
Lee et al.

(10) Patent No.: US 7,576,672 B2
(45) Date of Patent: Aug. 18, 2009

(54) ADAPTIVE DYNAMIC RANGE CONTROL

(75) Inventors: Chong U Lee, San Diego, CA (US); David Jonathan Julian, San Diego, CA (US); Harinath Garudadri, San Diego, CA (US); Somdeb Majumdar, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/843,914

(22) Filed: Aug. 23, 2007

(65) Prior Publication Data

US 2009/0021408 A1    Jan. 22, 2009

Related U.S. Application Data

(60) Provisional application No. 60/950,590, filed on Jul. 18, 2007.

(51) Int. Cl.
*H03M 3/02* (2006.01)
(52) U.S. Cl. .......................................... 341/143; 341/77
(58) Field of Classification Search .................. 341/76, 341/77, 143
See application file for complete search history.

(56) References Cited

U.S. PATENT DOCUMENTS

| | | | |
|---|---|---|---|
| 5,687,169 A | 11/1997 | Fullerton | |
| 5,764,696 A | 6/1998 | Barnes et al. | |
| 5,812,081 A | 9/1998 | Fullerton | |
| 5,832,035 A | 11/1998 | Fullerton | |
| 5,907,427 A | 5/1999 | Scalora et al. | |
| 5,952,956 A | 9/1999 | Fullerton | |
| 5,960,031 A | 9/1999 | Fullerton et al. | |
| 5,963,581 A | 10/1999 | Fullerton et al. | |
| 5,969,663 A | 10/1999 | Fullerton et al. | |
| 5,995,534 A | 11/1999 | Fullerton et al. | |
| 6,031,862 A | 2/2000 | Fullerton et al. | |
| 6,091,374 A | 7/2000 | Barnes | |
| 6,111,536 A | 8/2000 | Richards et al. | |
| 6,133,876 A | 10/2000 | Fullerton et al. | |
| 6,177,903 B1 | 1/2001 | Fullerton et al. | |
| 6,218,979 B1 | 4/2001 | Barnes et al. | |
| 6,295,019 B1 | 9/2001 | Richards et al. | |
| 6,297,773 B1 | 10/2001 | Fullerton et al. | |
| 6,300,903 B1 | 10/2001 | Richards et al. | |
| 6,304,623 B1 | 10/2001 | Richards et al. | |
| 6,351,652 B1 | 2/2002 | Finn et al. | |
| 6,354,946 B1 | 3/2002 | Finn | |
| 6,400,307 B2 | 6/2002 | Fullerton et al. | |
| 6,400,329 B1 | 6/2002 | Barnes | |
| 6,421,389 B1 | 7/2002 | Jett et al. | |

(Continued)

OTHER PUBLICATIONS

Aldajani, M.A. et al.; SNR performance of an adaptive sigma delta modulator, The 2001 IEEE International Symposium onCircuits and Systems, 2001. ISCAS 2001, pp. 392-395 vol. 1, May 6-9, 2001.*

(Continued)

*Primary Examiner*—Howard Williams
(74) *Attorney, Agent, or Firm*—Dang M. Vo (57) ABSTRACT

Apparatus and method for processing signals. A sigma-delta modulator is used. An adaptive dynamic range controller is configured to adaptively adjust the dynamic range of a signal output from the sigma-delta modulator.

107 Claims, 7 Drawing Sheets

U.S. PATENT DOCUMENTS

| | | |
|---|---|---|
| 6,430,208 B1 | 8/2002 | Fullerton et al. |
| 6,437,756 B1 | 8/2002 | Schantz |
| 6,462,701 B1 | 10/2002 | Finn |
| 6,466,125 B1 | 10/2002 | Richards et al. |
| 6,469,628 B1 | 10/2002 | Richards et al. |
| 6,483,461 B1 | 11/2002 | Matheney et al. |
| 6,489,893 B1 | 12/2002 | Richards et al. |
| 6,492,904 B2 | 12/2002 | Richards |
| 6,492,906 B1 | 12/2002 | Richards et al. |
| 6,501,393 B1 | 12/2002 | Richards et al. |
| 6,504,483 B1 | 1/2003 | Richards et al. |
| 6,512,455 B2 | 1/2003 | Finn et al. |
| 6,512,488 B2 | 1/2003 | Schantz |
| 6,515,603 B1 | 2/2003 | McGrath |
| 6,519,464 B1 | 2/2003 | Santhoff et al. |
| 6,529,568 B1 | 3/2003 | Richards et al. |
| 6,538,615 B1 | 3/2003 | Schantz |
| 6,539,213 B1 | 3/2003 | Richards et al. |
| 6,549,567 B1 | 4/2003 | Fullerton |
| 6,552,677 B2 | 4/2003 | Barnes et al. |
| 6,556,621 B1 | 4/2003 | Richards et al. |
| 6,560,463 B1 | 5/2003 | Santhoff |
| 6,571,089 B1 | 5/2003 | Richards et al. |
| 6,573,857 B2 | 6/2003 | Fullerton et al. |
| 6,577,691 B2 | 6/2003 | Richards et al. |
| 6,585,597 B2 | 7/2003 | Finn |
| 6,593,886 B2 | 7/2003 | Schantz |
| 6,606,051 B1 | 8/2003 | Fullerton et al. |
| 6,611,234 B2 | 8/2003 | Fullerton et al. |
| 6,614,384 B2 | 9/2003 | Hall et al. |
| 6,621,462 B2 | 9/2003 | Barnes |
| 6,636,566 B1 | 10/2003 | Roberts et al. |
| 6,636,567 B1 | 10/2003 | Roberts et al. |
| 6,636,573 B2 | 10/2003 | Richards et al. |
| 6,642,903 B2 | 11/2003 | Schantz |
| 6,661,342 B2 | 12/2003 | Hall et al. |
| 6,667,724 B2 | 12/2003 | Barnes et al. |
| 6,670,909 B2 | 12/2003 | Kim |
| 6,671,310 B1 | 12/2003 | Richards et al. |
| 6,674,396 B2 | 1/2004 | Richards et al. |
| 6,677,796 B2 | 1/2004 | Brethour et al. |
| 6,700,538 B1 | 3/2004 | Richards |
| 6,710,736 B2 | 3/2004 | Fullerton et al. |
| 6,717,992 B2 | 4/2004 | Cowie et al. |
| 6,748,040 B1 | 6/2004 | Johnson et al. |
| 6,750,757 B1 | 6/2004 | Gabig, Jr. et al. |
| 6,759,948 B2 | 7/2004 | Grisham et al. |
| 6,760,387 B2 | 7/2004 | Langford et al. |
| 6,762,712 B2 | 7/2004 | Kim |
| 6,763,057 B1 | 7/2004 | Fullerton et al. |
| 6,763,282 B2 | 7/2004 | Glenn et al. |
| 6,774,846 B2 | 8/2004 | Fullerton et al. |
| 6,774,859 B2 | 8/2004 | Schantz et al. |
| 6,778,603 B1 | 8/2004 | Fullerton et al. |
| 6,781,530 B2 | 8/2004 | Moore |
| 6,782,048 B2 | 8/2004 | Santhoff |
| 6,788,730 B1 | 9/2004 | Richards et al. |
| 6,822,604 B2 | 11/2004 | Hall et al. |
| 6,823,022 B1 | 11/2004 | Fullerton et al. |
| 6,836,223 B2 | 12/2004 | Moore |
| 6,836,226 B2 | 12/2004 | Moore |
| 6,845,253 B1 | 1/2005 | Schantz |
| 6,847,675 B2 | 1/2005 | Fullerton et al. |
| 6,879,878 B2 | 4/2005 | Glenn et al. |
| 6,882,301 B2 | 4/2005 | Fullerton |
| 6,895,034 B2 | 5/2005 | Nunally et al. |
| 6,900,732 B2 | 5/2005 | Richards |
| 6,906,625 B1 | 6/2005 | Taylor et al. |
| 6,907,244 B2 | 6/2005 | Santhoff et al. |
| 6,912,240 B2 | 6/2005 | Kumar et al. |
| 6,914,949 B2 | 7/2005 | Richards et al. |
| 6,917,284 B2 | 7/2005 | Grisham et al. |
| 6,919,838 B2 | 7/2005 | Santhoff |
| 6,922,166 B2 | 7/2005 | Richards et al. |
| 6,922,177 B2 | 7/2005 | Barnes et al. |
| 6,925,109 B2 | 8/2005 | Richards et al. |
| 6,933,882 B2 | 8/2005 | Fullerton |
| 6,937,639 B2 | 8/2005 | Pendergrass et al. |
| 6,937,663 B2 | 8/2005 | Jett et al. |
| 6,937,667 B1 | 8/2005 | Fullerton et al. |
| 6,937,674 B2 | 8/2005 | Santhoff et al. |
| 6,947,492 B2 | 9/2005 | Santhoff et al. |
| 6,950,485 B2 | 9/2005 | Richards et al. |
| 6,954,480 B2 | 10/2005 | Richards et al. |
| 6,959,031 B2 | 10/2005 | Haynes et al. |
| 6,959,032 B1 | 10/2005 | Richards et al. |
| 6,963,727 B2 | 11/2005 | Shreve |
| 6,980,613 B2 | 12/2005 | Krivokapic |
| 6,989,751 B2 | 1/2006 | Richards |
| 7,015,793 B2 | 3/2006 | Gabig, Jr. et al. |
| 7,020,224 B2 | 3/2006 | Krivokapic |
| 7,027,425 B1 | 4/2006 | Fullerton et al. |
| 7,027,483 B2 | 4/2006 | Santhoff et al. |
| 7,027,493 B2 | 4/2006 | Richards |
| 7,030,806 B2 | 4/2006 | Fullerton |
| 7,042,417 B2 | 5/2006 | Santhoff et al. |
| 7,046,187 B2 | 5/2006 | Fullerton et al. |
| 7,046,618 B2 | 5/2006 | Santhoff et al. |
| 7,061,416 B2 | 6/2006 | Nagai |
| 7,068,196 B2 * | 6/2006 | Noguchi et al. ............. 341/143 |
| 7,069,111 B2 | 6/2006 | Glenn et al. |
| 7,075,476 B2 | 7/2006 | Kim |
| 7,079,827 B2 | 7/2006 | Richards et al. |
| 7,099,367 B2 | 8/2006 | Richards et al. |
| 7,099,368 B2 | 8/2006 | Santhoff et al. |
| 7,129,886 B2 | 10/2006 | Hall et al. |
| 7,132,975 B2 | 11/2006 | Fullerton et al. |
| 7,145,954 B1 | 12/2006 | Pendergrass et al. |
| 7,148,791 B2 | 12/2006 | Grisham et al. |
| 7,151,473 B2 | 12/2006 | Fontaine et al. |
| 7,151,490 B2 | 12/2006 | Richards |
| 7,167,525 B2 | 1/2007 | Santhoff et al. |
| 7,170,408 B2 | 1/2007 | Taylor et al. |
| 7,184,938 B1 | 2/2007 | Lansford et al. |
| 7,190,722 B2 | 3/2007 | Lakkis et al. |
| 7,190,729 B2 | 3/2007 | Siwiak |
| 7,206,334 B2 | 4/2007 | Siwiak |
| 7,209,724 B2 | 4/2007 | Richards et al. |
| 7,230,980 B2 | 6/2007 | Langford et al. |
| 7,239,277 B2 | 7/2007 | Fullerton et al. |
| RE39,759 E | 8/2007 | Fullerton |
| 7,256,727 B2 | 8/2007 | Fullerton et al. |
| 7,271,779 B2 | 9/2007 | Hertel |
| 7,391,350 B2 * | 6/2008 | Aldajani et al. ............. 341/143 |
| 2005/0275576 A1 * | 12/2005 | Fudge et al. ................. 341/155 |
| 2006/0097899 A1 * | 5/2006 | Nagai ......................... 341/143 |

OTHER PUBLICATIONS

Chakravarthy, An Amplitude-Controlled Adaptive Delta Sigma Modulator, Jan. 1979, The Radio and Electronic Engineer, vol. 49 No. 1, pp. 49-54, Institute of Electronics and Radio Engineers.*

Yu, J. et al., Adaptive Quantisation for One-Bit Sigma-Delta Modulation, IEE, IEE Proceedings Circuits, Devices and Systems, Feb. 1992, vol. 139, No. 1, pp. 39-44. ISSN 0956-3768, INSPEC Accession # 4167525.*

International Search Report—PCT/US08/051231—International Search Report, European Patent Office, Jun. 3, 2008.

* cited by examiner

ADAPTIVE DYNAMIC RANGE CONTROL

CLAIM OF PRIORITY UNDER 35 U.S.C. §119

The present Application for Patent claims priority to Provisional Application No. 60/950,590 entitled "Adaptive Dynamic Range Control," filed Jul. 18, 2007, and assigned to the assignee hereof and hereby expressly incorporated by reference herein.

BACKGROUND

1. Field

The disclosure relates generally to the electronic arts, and more specifically to apparatuses and techniques for adaptive dynamic range control for sigma-delta modulators and other circuits.

2. Background

Sigma-delta modulators and other similar circuits have existed for many years and have a wide range of applications such as communication systems, audio systems, precision measurement devices, and many others. In audio applications, for example, a sigma-delta modulator is often used to covert an audio signal into a stream of one-bit digital signals. The conversion process is performed by oversampling the audio signal, thus spreading the quantization noise over a larger spectrum. The modulator further modifies the spectral properties of the quantization noise such that it is low in the band of interest (i.e., the audio band), and high elsewhere.

In many audio systems, the digital bit stream is processed, stored, retrieved, or transmitted before being converted back to an audio signal for playback. In these systems, errors can be introduced into the digital bit stream due to processing errors, unreliable storage mediums, or disturbances in the transmission medium. These errors can result in significant audio artifacts.

In many audio systems, there is a further desire to lower the oversampling ratio, in order to save computational power and transmission bandwidth. The quantization noise increases in the band of interest (i.e., the audio band) as the oversampling ratio is decreased.

Accordingly, there is a need in the art for improved sigma-delta modulators and similar devices that address audio quality due to errors in the digital bit stream and power, bandwidth limitations.

SUMMARY

In one aspect of the disclosure, an apparatus for processing signals includes a sigma-delta modulator, and an adaptive dynamic range controller configured to adaptively adjust the dynamic range of a signal output from the sigma-delta modulator.

In another aspect of the disclosure, an apparatus is configured to receive a signal output from a sigma-delta modulator, wherein the dynamic range of the received signal has been adaptively adjusted. The apparatus includes a filter, and an adaptive dynamic range controller configured to produce an output comprising the received signal with its dynamic range inversely adjusted and provide the output to the filter.

In yet another aspect of the disclosure, an apparatus for processing signals includes a sigma-delta modulator, and means for adaptively adjusting the dynamic range of a signal output from the sigma-delta modulator In a further aspect of the disclosure, an apparatus is configured to receive a signal output from a sigma-delta modulator, wherein the dynamic range of the received signal has been adaptively adjusted. The apparatus includes means for processing the received signal to produce an output comprising the received signal with its dynamic range inversely adjusted, and means for filtering the output In yet a further aspect of the disclosure, a method for processing signals includes passing a signal through a sigma-delta modulator, and adaptively adjusting the dynamic range of the signal output from the sigma-delta modulator.

In still yet a further aspect of the disclosure, a method to process a signal received from an output of a sigma-delta modulator, wherein the dynamic range of the received signal has been adaptively adjusted, includes processing the received signal to produce an output comprising the received signal with its dynamic range inversely adjusted, and filtering the output.

In another aspect of the disclosure, a computer-program product for processing signals includes a machine-readable medium comprising instructions executable by a processing system, the instructions including code for passing a signal from a sigma-delta modulator, and adaptively adjusting the dynamic range of the signal output from the sigma-delta modulator.

In yet another aspect of the disclosure, a computer-program product for processing signals includes a machine-readable medium comprising instructions executable by a processing system configured to receive a signal output from a sigma-delta modulator, wherein the dynamic range of the received signal has been adaptively adjusted, the instructions including code for processing the received signal to produce an output comprising the received signal with its dynamic range inversely adjusted, and filtering the output.

In still yet another aspect of the disclosure, an apparatus for processing signals includes a filter configured to receive an input signal and a scaled signal and to generate a filtered signal, a quantizer configured to generate a quantized signal based on the filtered signal, and an adaptive dynamic range controller configured to generate the scaled signal based on the quantized signal.

In a further aspect of the disclosure, an apparatus is configured to receive a signal output from a sigma-delta modulator, wherein the dynamic range of the received signal has been adaptively adjusted. The apparatus includes an adaptive dynamic range controller configured to receive the signal from the sigma-delta modulator and generate a scaled signal, and a filter configured to receive the scaled signal.

In yet a further aspect of the disclosure, an apparatus for processing signals includes means for filtering an input signal based on a scaled signal to generate a filtered signal, means for generating a quantized signal based on the filtered signal, and means for generating the scaled signal based on the quantized signal.

In still yet another aspect of the disclosure, an apparatus is configured to receive a signal output from a sigma-delta modulator, wherein the dynamic range of the received signal has been adaptively adjusted. The apparatus includes means for generating a scaled signal based on the received signal output from the sigma-delta modulator, and means for filtering the scaled signal.

In a further aspect of the disclosure, a method for processing signals includes filtering an input signal based on a scaled signal to generate a filtered signal, generating a quantized signal based on the filtered signal, and generating the scaled signal based on the quantized signal.

In yet a further aspect of the disclosure, a method for processing a signal received from an output of a sigma-delta modulator, wherein the dynamic range of the received signal has been adaptively adjusted, includes generating a scaled signal based on the received signal output from the sigma-delta modulator, and filtering the scaled signal.

In still yet a further aspect of the disclosure, a computer-program product for processing signals includes a machine-readable medium comprising instructions executable by a processing system, the instructions includes code for filtering an input signal based on a scaled signal to generate a filtered signal, generating a quantized signal based on the filtered signal, and generating the scaled signal based on the quantized signal.

In another aspect of the disclosure, a computer-program product for processing signals includes a machine-readable medium comprising instructions executable by a processing system configured to receive a signal output from a sigma-delta modulator, wherein the dynamic range of the received signal has been adaptively adjusted, the instructions include code for generating a scaled signal based on the received signal output from the sigma-delta modulator, and filtering the scaled signal.

In yet another aspect of the disclosure, a headset includes a signal source configured to generate a signal, a sigma-delta modulator configured to receive the signal from the signal source and produce an output, and an adaptive dynamic range controller configured to adaptively adjust the dynamic range of the output from the sigma-delta modulator.

In still yet another aspect of the disclosure, a headset is configured to receive a signal output from a sigma-delta modulator, wherein the dynamic range of the received signal has been adaptively adjusted. The headset includes a signal load, an adaptive dynamic range controller configured to produce an output comprising the received signal with its dynamic range inversely adjusted, and a filter configured to filter the output from the adaptive dynamic range controller and provide the filtered output to the signal load.

In a further aspect of the disclosure, a headset includes a signal source configured to generate a signal, a filter configured to receive the signal from the signal source and a scaled signal and to generate a filtered signal, a quantizer configured to generate a quantized signal based on the filtered signal, and an adaptive dynamic range controller configured to generate the scaled signal based on the quantized signal.

In yet a further aspect of the disclosure, a headset is configured to receive a signal output from a sigma-delta modulator, wherein the dynamic range of the received signal has been adaptively adjusted, the handset includes an adaptive dynamic range controller configured to receive the signal from the sigma-delta modulator and generate a scaled signal, a filter configured to receive the scaled signal and generate a filtered signal, and a signal load configured to receive the filtered signal.

It is understood that other aspects of the invention will become readily apparent to those skilled in the art from the following detailed description, wherein various aspects of the invention are shown and described by way of illustration. As will be realized, the invention is capable of other and different configurations and implementations and its several details are capable of modification in various other respects, all without departing from the scope of this disclosure. Accordingly, the drawings and detailed description are to be regarded as illustrative in nature and not as restrictive.

DETAILED DESCRIPTION

The detailed description set forth below in connection with the appended drawings is intended as a description of various configurations of the invention and is not intended to represent the only configurations in which the invention may be practiced. The detailed description includes specific details for the purpose of providing a thorough understanding of the invention. However, it will be apparent to those skilled in the art that the invention may be practiced without these specific details. In some instances, well-known structures and components are shown in block diagram form in order to avoid obscuring the concepts of the invention.

Figure 1:
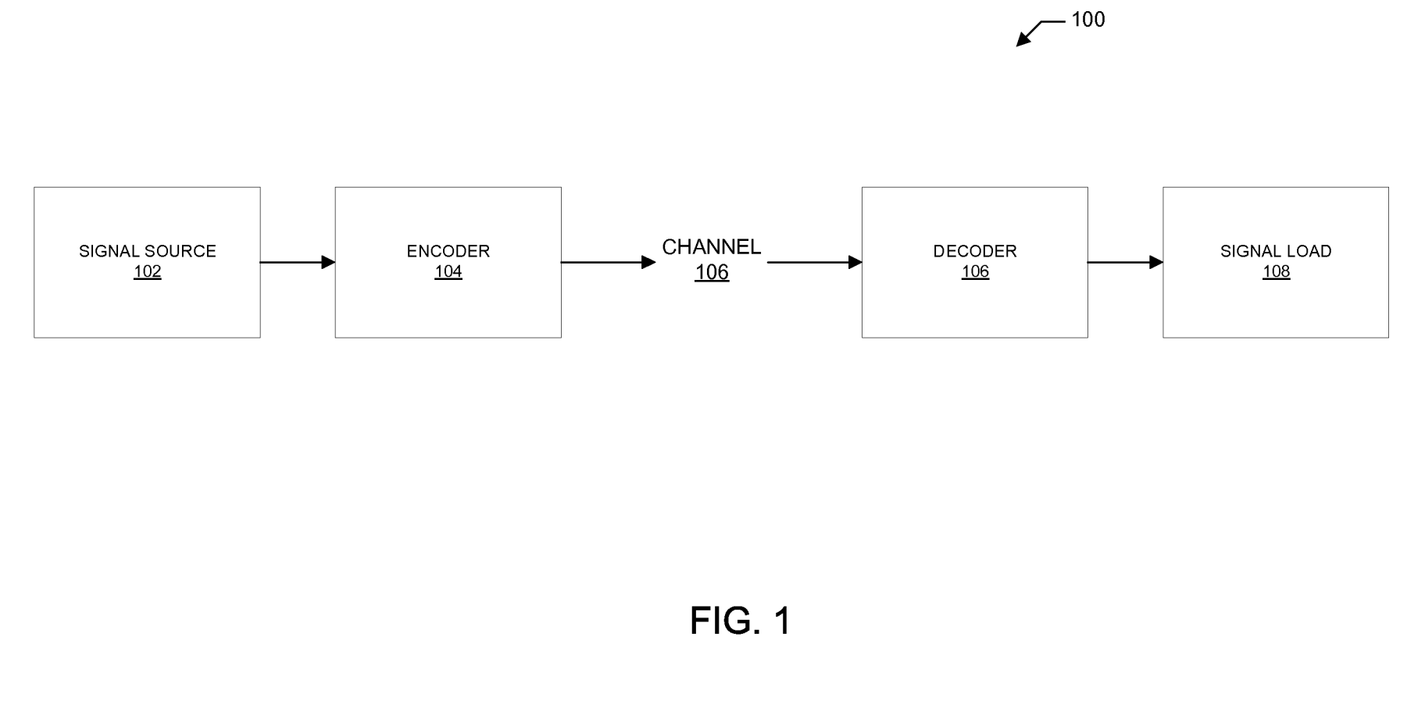
FIG. 1 is a conceptual diagram illustrating an example of an audio system.

FIG. 1 is a conceptual diagram illustrating an example of an audio system. The audio system 100 is shown with an encoder 104 which converts an audio signal from a signal source 102 to a digital bit stream. The digital bit stream may be processed, stored, retrieved or transmitted before being converted back to an audio signal by a decoder 108 for presentation to a signal load 110. The processing, storage, retrieval, or transmission of the digital bit stream is broadly represented in FIG. 1 as a channel 106.

The ensemble of components shown in FIG. 1 is intended to broadly represent many different types of audio systems. By way of example, the audio system 100 may represent a headset engaging in wireless communications with a cellular phone, personal (PDA), desktop or laptop computer, or any other suitable device. In this example, the signal source 102 and encoder 104 represent the sending device and the decoder 108 and signal load 110 represent the receiving device. The signal source 102 comprises the audio circuitry associated with a microphone and the encoder 104 converts the audio signal from the audio circuitry into a digital bit stream. The channel 106 represents the wireless channel between the two devices including various physical layer processing (e.g., RF front-end processing, symbol mapping, turbo coding etc.). The decoder 108 converts the digital bit stream to an audio signal and presents it to the signal load 110, which may be a speaker on the receiving phone, memory, a component for further routing of the audio signal.

Another example of an audio system is a digital audio player, sometimes referred to as an MP3 player because of the MP3 format's ubiquity. The digital audio player may be a stand alone device or integrated into a cellular phone, PDA, desktop or laptop computer, or any other suitable device. In this example, the signal source 102 may be an integrated FM tuner. The encoder 104 converts the audio signal from the FM tuner to a digital data stream and stores this information in memory in the form of an audio file. The memory and associated processing is represented by the channel 106. The digital data stream, or contents of the audio file, is read out of memory and converted to an analog signal by the decoder 108 and presented to the signal load 110, typically a speaker.

Various concepts will now be presented with reference to the encoder 104 and decoder 108 of FIG. 1. These concepts are designed to address audio quality due to errors in the digital bit stream by modulating the amplitude of disturbances at the decoder 108 according to the instantaneous amplitude of the original audio signal. While these concepts are well suited for the audio systems discussed thus far, those skilled in the art will readily recognize that these concepts may be extended to many other types of audio systems, and may also be applicable to systems supporting other type of media.

Figure 2:
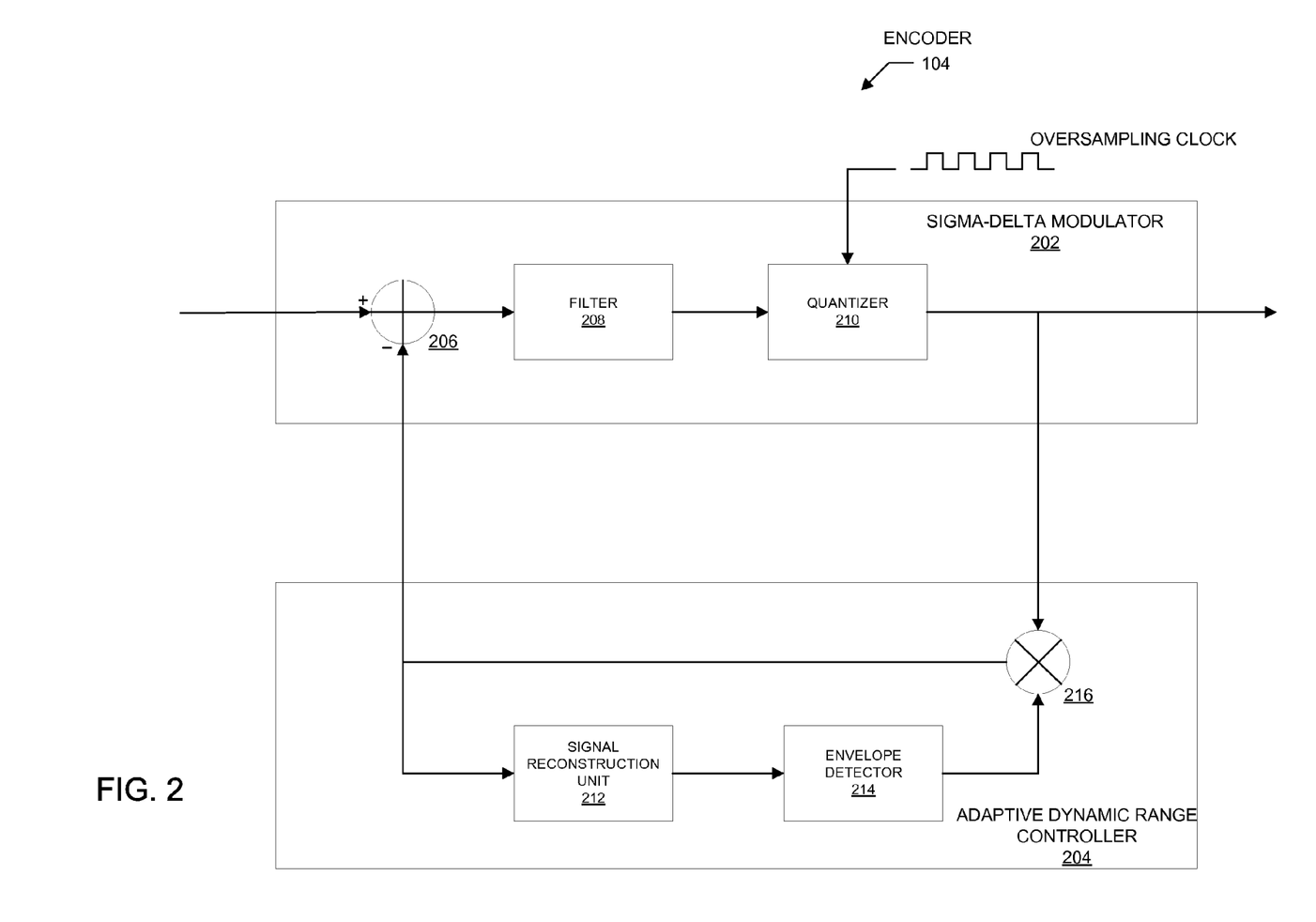
FIG. 2 is a conceptual block diagram illustrating an example of an encoder with a first order sigma-delta modulator.

FIG. 2 is a conceptual block diagram illustrating an example of an encoder. In this example, the encoder 104 will be described as an analog-to-digital converter (ADC), but as those skilled in the art will readily appreciate, the various concepts presented may be equally applicable to an encoder configured as a digital-to-analog converter (DAC).

Referring to FIG. 2, the encoder 104 includes a first order sigma-delta modulator, although higher order modulators may be used to decrease quantization noise. In this example, an audio signal is input to a summing node 206. The summing node 206 also receives an input from an adaptive dynamic range controller 204. The difference between the two inputs is provided to a filter 208 that provides an integration function. The filtered output is then provided to a one-bit quantizer 210. The quantizer 210 generates the encoder output comprising a digital bit stream at the oversampling frequency (i.e., a frequency much greater than the Nyquist frequency). The digital bit stream is also fed back to the adaptive dynamic range controller 204 to generate the input to the summing node 206.

The adaptive dynamic range controller 204 is configured to adaptively adjust the dynamic range of a signal output from the sigma-delta modulator 202. This is achieved by passing the digital bit stream output from the sigma-delta modulator 202 through a signal reconstruction unit 212 and an envelope detector 214 and then using the result to scale the digital bit stream through a multiplication node 216. The scaled output from the multiplication node 216 is provided to the sigma-delta modulator 202 where it is subtracted from the audio input signal at the summing node 206. As a result, the dynamic range of the signal output from the sigma-delta modulator 202 is adjusted inversely proportional to the instantaneous amplitude of the audio input signal. Stated differently, low signal amplitude regions in the audio signal receive the maximum increase in dynamic range. Thus, any audio artifacts picked up in the channel will be significantly reduced at the decoder 108 (see FIG. 1) in the low signal amplitude regions, where the audio is most vulnerable to noise.

Figure 3:
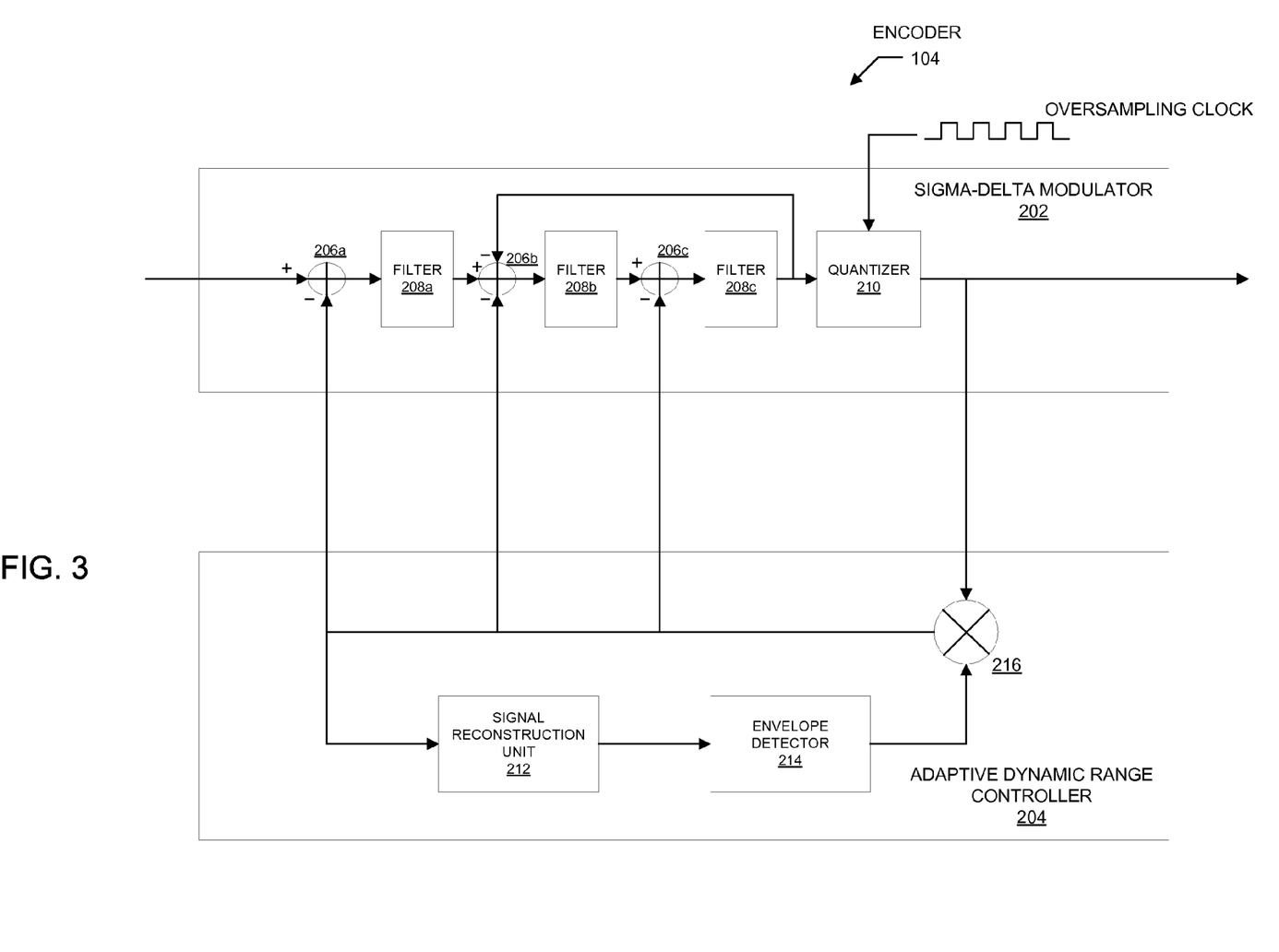
FIG. 3 is a conceptual block diagram illustrating an example of an encoder with a third order sigma-delta modulator.

As discussed earlier, higher order modulation may be used to better shape the quantization noise out of the audio signal band. An example of an encoder with a third order sigma-delta modulator will now be presented with reference to FIG. 3. The sigma-delta modulator 202 in his example is an extension of the first order sigma-delta modulator discussed in connection with FIG. 2. Several integration stages are implemented with three filters 208a-208c. A summing node 206a-206c is provided at the input of each stage to subtract out the scaled output from the adaptive dynamic range controller 204. A feedback path is also introduced between the output of the last stage and the input to the second stage.

Figure 4:
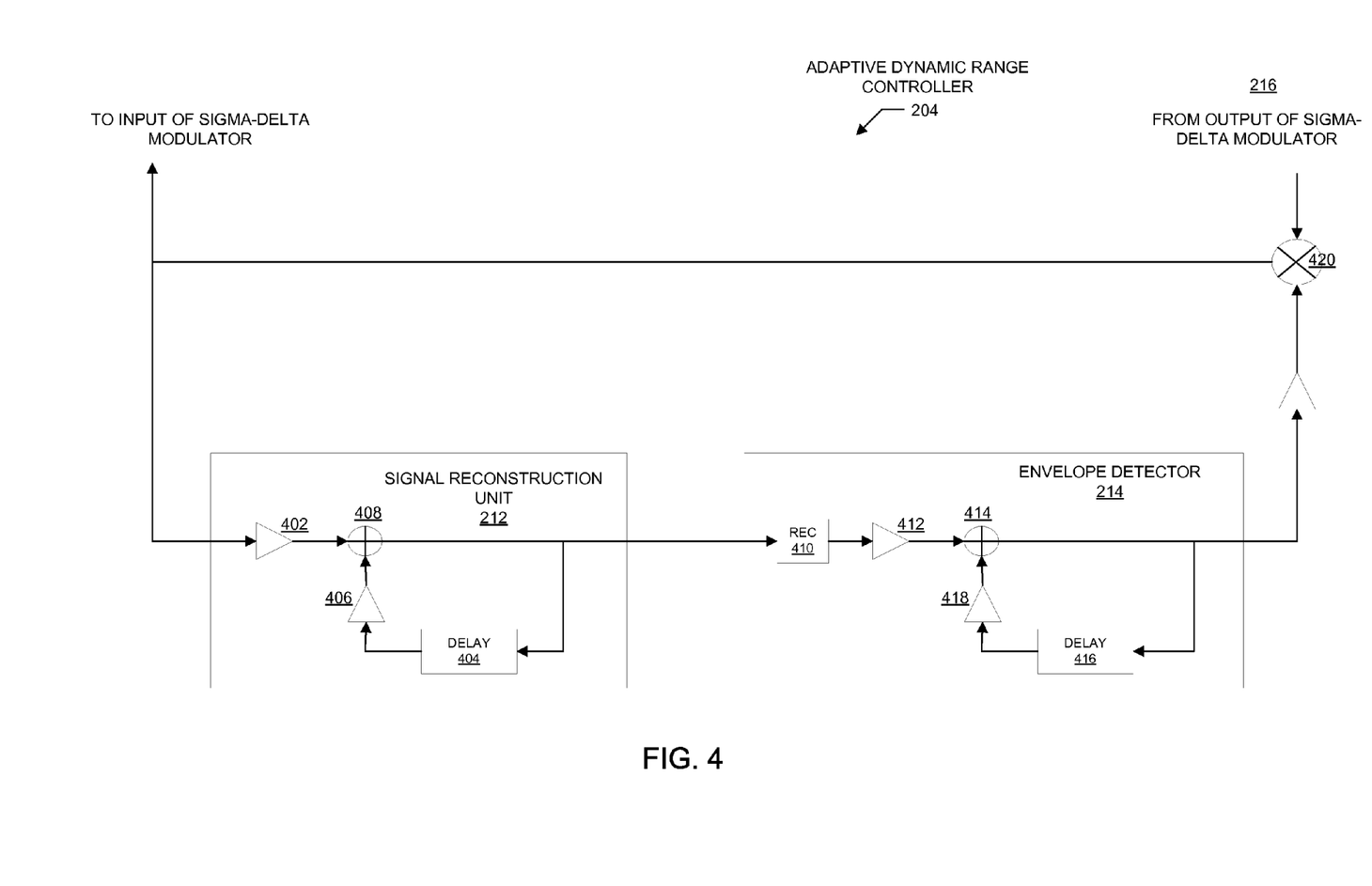
FIG. 4 is a conceptual diagram illustrating an example of an adaptive dynamic range controller.

FIG. 4 is a conceptual diagram illustrating an example of an adaptive dynamic range controller in more detail. The signal reconstruction unit 212 includes a one-pole filter comprising a delay element 404 for delaying the input and a summing node 408 to combine the input with the delayed input. The gains in the filter and feedback paths are individually controlled with amplifiers 402, 406. The filter functions to provide a coarse reconstruction of the audio signal input to the encoder.

The envelope detection is similarly done by passing a rectified output from the signal reconstruction unit 212 through a one-pole filter to smooth out any discontinuities due to the coarse reconstruction of the audio signal and to further reduce high frequency quantization noise output from the sigma-delta modulator. The envelope detector 214 includes a rectifier 410 followed by a one-pole filter comprising a delay element 416 for delaying the input from the signal reconstruction unit 212 and a summing node 414 to combine the input with the delayed version. The gains in the filter and feedback paths are individually controlled with amplifiers 412, 418.

The adaptive dynamic range controller 204 may also include a variable gain amplifier 420 at the output of the envelope detector 212. The variable gain of the amplifier 420 that may be used to change the amplitude of the envelope signal.

Figure 5:
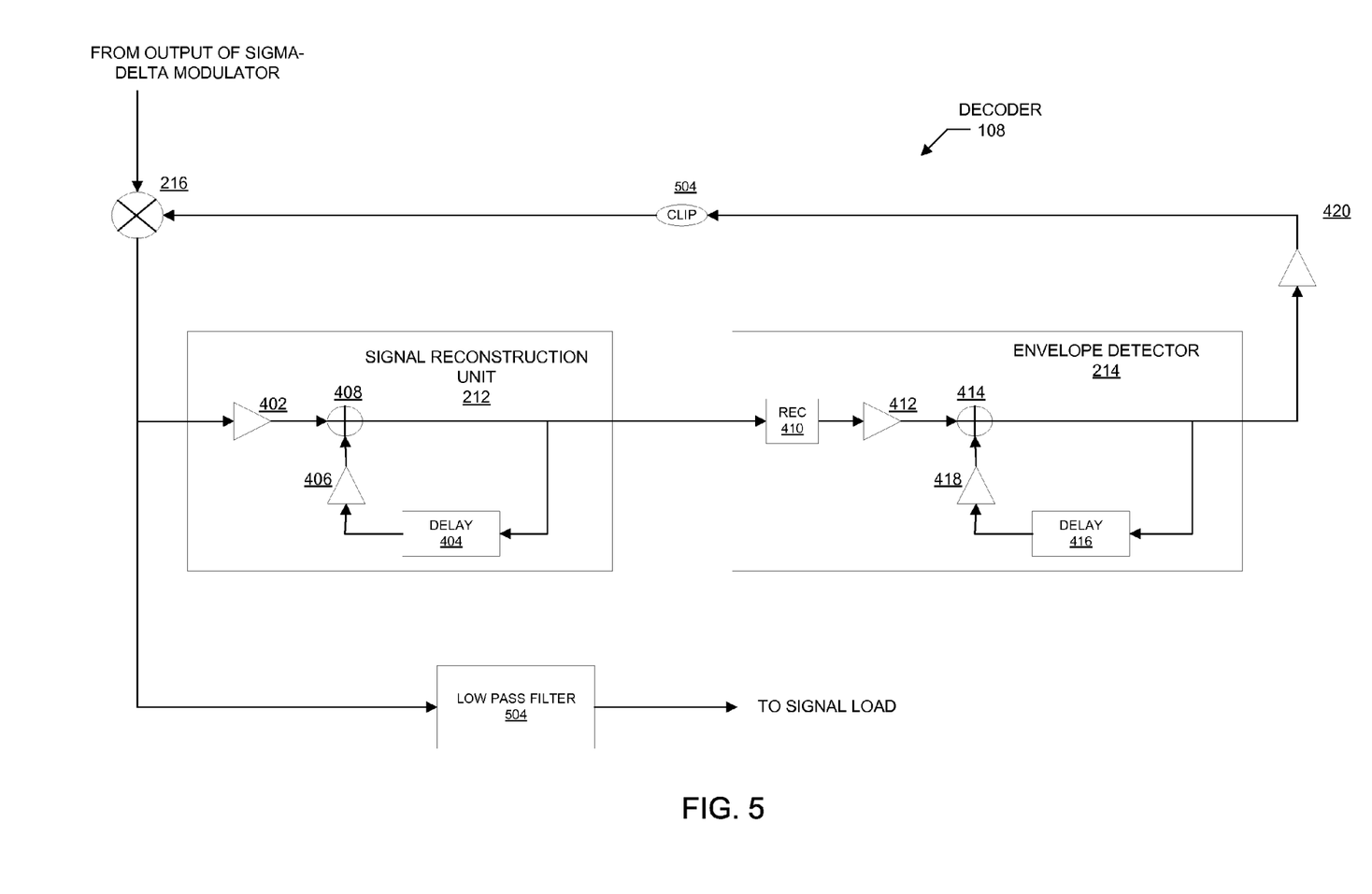
FIG. 5 is a schematic diagram illustrating an example of a decoder.

FIG. 5 is a schematic diagram illustrating an example of a decoder. The decoder 108 includes an adaptive dynamic range controller 204 that functions to adjust the dynamic range of the digital bit stream to recover the audio signal. More precisely, the adaptive dynamic range controller 204 adaptively adjusts the dynamic range of the digital bit stream directly proportional to the instantaneous amplitude of the audio signal. As result, low signal amplitude regions in the audio signal receive the maximum decrease in dynamic range, which significantly reduces any audio artifacts picked up in the channel.

The adaptive dynamic range controller 204 is similar to that described earlier in connection with the encoder 202. It has a signal reconstruction unit 212 followed by an envelope detector 214. Both the signal reconstruction unit 212 and the envelope detector 214 are shown as one-pole filters with independently controlled gains in the filter and feedback paths. Preferably, the combination of gains of the each filter is one. In some configurations, the gains of the amplifiers 402, 406, 412, 418 may be tunable parameters. A variable gain amplifier 420 provides a tunable parameter and a clipping circuit 502 prevents the output of the adaptive dynamic range controller from saturating. The tunable parameters may be used to address issues such as the slew-rate control of the envelope detection and the stability of the core sigma-delta modulator loop.

The decoder 108 also includes a low pass filter 504. The filter 504 functions as a decimator that filters the digital bit stream to the Nyquist sampling rate to recover the underlying audio bandwidth. The output from the filter 504 may be provided to the signal load 110 (see FIG. 1), which may be an audio speaker, memory, transmitter, or other suitable device. In the case of an audio speaker, the digital bit stream from the adaptive dynamic range controller may be provided to a class-D amplifier that drives an audio output comprising a speaker and a low pass filter. As a result of this decoder configuration, the power consumed by the class-D amplifier is proportional to the audio signal level (i.e., loudness). This may provide an added benefit in consumer electronic devices that need to conserve battery power.

Figure 6A:
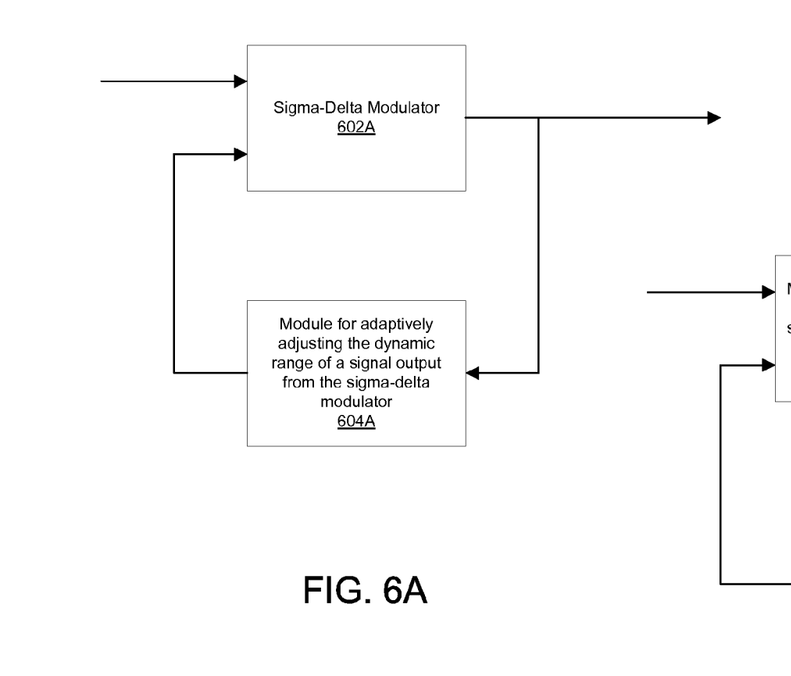
FIGS. 6A and 6B are functional block diagrams illustrating examples of an encoder.
Figure 6B:
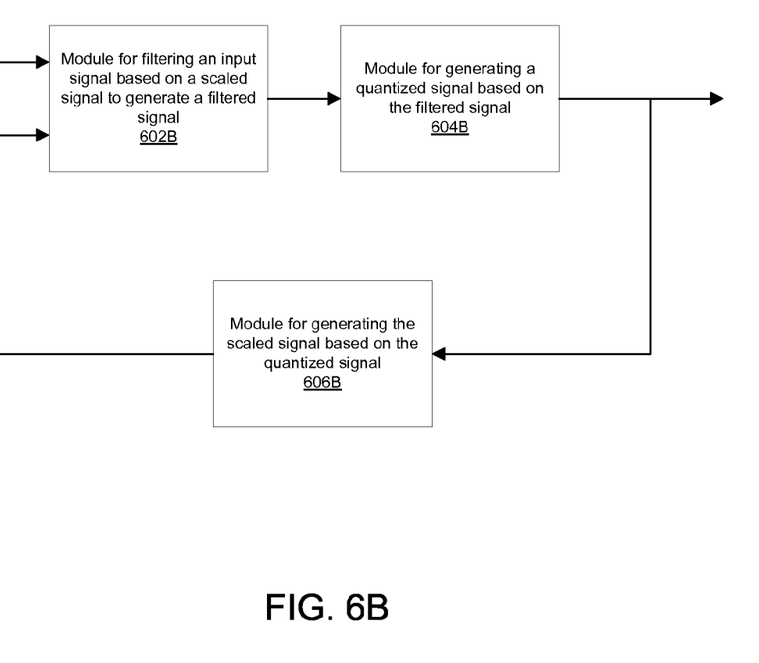

FIGS. 6A and 6B are functional block diagrams illustrating examples of an encoder. In FIG. 6A, an apparatus for processing signals includes a sigma-delta modulator 602A and a module 604A for adaptively adjusting the dynamic range of a signal output from the sigma-delta modulator. In FIG. 6B, an apparatus for processing signals includes a module 602B for filtering an input signal based on a scaled signal to generate a filtered signal, a module 604B for generating a quantized signal based on the filtered signal, and a module 606B for generating the scaled signal based on the quantized signal.

Figure 7A:
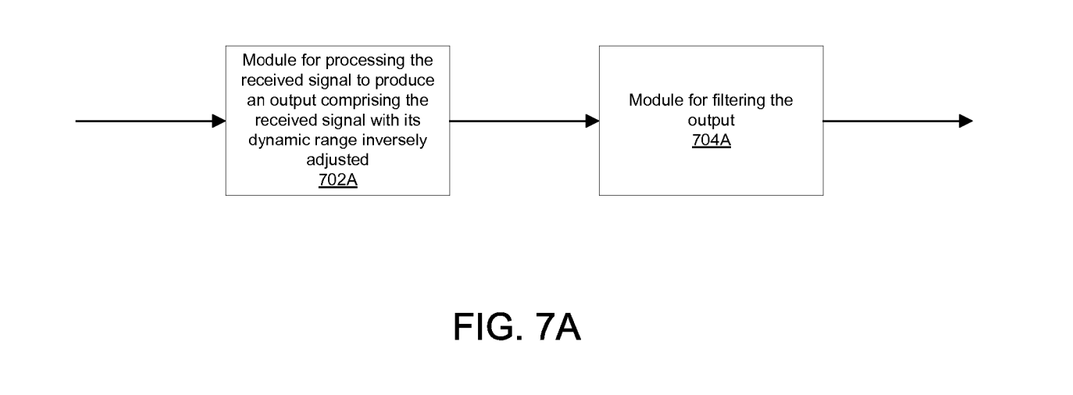
FIGS. 7A and 7B are functional block diagrams illustrating examples of a decoder.
Figure 7B:
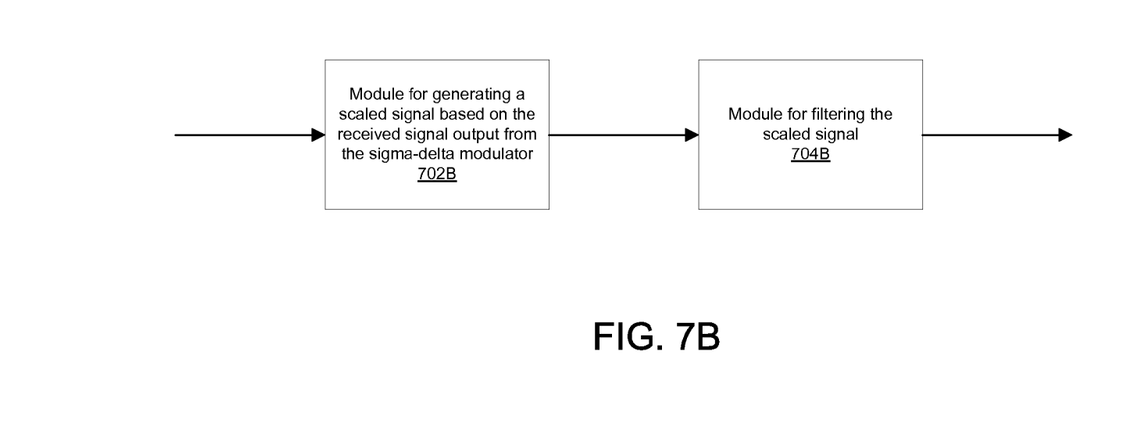

FIGS. 7A and 7B are functional block diagrams illustrating examples of a decoder. In FIG. 7A, an apparatus is configured to receive a signal output from a sigma-delta modulator, wherein the dynamic range of the received signal has been adaptively adjusted. The apparatus includes a module 702A for processing the received signal to produce an output comprising the received signal with its dynamic range inversely adjusted, and a module 704A for filtering the output. In FIG. 7B, an apparatus is also configured to receive a signal output from a sigma-delta modulator, wherein the dynamic range of the received signal has been adaptively adjusted. The apparatus includes a module 702B for generating a scaled signal based on the received signal output from the sigma-delta modulator, and a module 704B for filtering the scaled signal.

The various illustrative logical blocks, modules, and circuits described in connection with the aspects disclosed herein may be implemented within or performed by an integrated circuit ("IC"), an access terminal, or an access point. The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The teachings herein may be incorporated into (e.g., implemented within or performed by) a variety of apparatuses (e.g., devices). For example, one or more aspects taught herein may be incorporated into a phone (e.g., a cellular phone), a personal data assistant ("PDA"), an entertainment device (e.g., a music or video device), a headset (e.g., headphones, an earpiece, etc.), a microphone, a medical device (e.g., a biometric sensor, a heart rate monitor, a pedometer, an EKG device, etc.), a user I/O device (e.g., a watch, a remote control, a light switch, a keyboard, a mouse, etc.), a tire pressure monitor, a computer, a point-of-sale device, an entertainment device, a hearing aid, a set-top box, or any other suitable device.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The invention claimed is:

1. An apparatus for processing signals, comprising:
    a sigma-delta modulator; and
    an adaptive dynamic range controller configured to adaptively adjust the dynamic range of a signal output from the sigma-delta modulator, such that the dynamic range is adjusted inversely proportional to an instantaneous amplitude of a signal input to the sigma-delta modulator.

2. The apparatus of claim 1 wherein the adaptive dynamic range controller further comprises an envelope detector configured to generate an envelope of the signal input to the sigma-delta modulator, apply the envelope to the signal output from the sigma-delta modulator to generate a feedback signal, and provide the feedback signal to the sigma-delta modulator.

3. The apparatus of claim 2 wherein the adaptive dynamic range controller further comprises a multiplier configured to apply the envelope to the signal output from the sigma-delta modulator to generate the feedback signal.

4. The apparatus of claim 2 wherein the adaptive dynamic range controller further comprises a variable gain amplifier configured to adjust an amplitude of the envelope.

5. The apparatus of claim 2 wherein the adaptive dynamic range controller further comprises a signal reconstruction unit configured to reconstruct the signal input to the sigma-delta modulator, said envelope detector being further configured to generate the envelope from the reconstructed signal.

6. The apparatus of claim 5 wherein the envelope detector further comprises a rectifier configured to rectify the reconstructed signal.

7. The apparatus of claim 6 wherein the envelope detector further comprises a filter, and wherein the rectifier is further configured to provide the rectified reconstructed signal to the filter.

8. The apparatus of claim 5 wherein the signal reconstruction unit is further configured to reconstruct the signal input to the sigma-delta modulator from the feedback signal.

9. The apparatus of claim 5 wherein the signal reconstruction unit comprises a filter configured to reconstruct the signal input to the sigma-delta modulator.

10. The apparatus of claim 2 wherein the sigma-delta modulator comprises a feedback loop, and wherein the adaptive dynamic range controller is further configured to provide the feedback signal to the feedback loop in the sigma-delta modulator.

11. An apparatus configured to receive a signal output from a sigma-delta modulator, the apparatus comprising:
    a filter; and
    an adaptive dynamic range controller configured to adaptively adjust the dynamic range of the received signal, such that the dynamic range is adjusted directly proportional to an instantaneous amplitude of a signal input to the sigma-delta modulator, to produce an output signal comprising the received signal with its dynamic range adjusted, and to provide the output signal to the filter.

12. The apparatus of claim 11 wherein the adaptive dynamic range controller further comprises an envelope detector configured to generate an envelope of the output signal, and apply the envelope to the received signal.

13. The apparatus of claim 12 wherein the adaptive dynamic range controller further comprises a multiplier configured to apply the envelope to the received signal.

14. The apparatus of claim 12 wherein the adaptive dynamic range controller further comprises a variable gain amplifier configured to adjust an amplitude of the envelope.

15. The apparatus of claim 12 wherein the adaptive dynamic range controller further comprises a signal reconstruction unit configured to reconstruct the signal input to the sigma-delta modulator, said envelope detector being further configured to generate the envelope from the reconstructed signal.

16. The apparatus of claim 15 wherein the envelope detector further comprises a rectifier configured to rectify the reconstructed signal.

17. The apparatus of claim 16 wherein the envelope detector further comprises a filter, wherein the rectifier is further configured to provide the rectified reconstructed signal to the filter.

18. The apparatus of claim 15 wherein the signal reconstruction unit is further configured to reconstruct the signal input to the sigma-delta modulator from the received signal.

19. The apparatus of claim 15 wherein the signal reconstruction unit comprises a filter configured to reconstruct the signal input to the sigma-delta modulator.

20. An apparatus for processing signals, comprising:
a sigma-delta modulator; and
means for adaptively adjusting the dynamic range of a signal output from the sigma-delta modulator, such that the dynamic range is adjusted inversely proportional to an instantaneous amplitude of a signal input to the sigma-delta modulator.

21. The apparatus of claim 20 wherein the means for adaptively adjusting the dynamic range of a signal output from the sigma-delta modulator comprises means for generating an envelope of the signal input to the sigma-delta modulator, and means for applying the envelope to the signal output from the sigma-delta modulator to generate a feedback signal for the sigma-delta modulator.

22. The apparatus of claim 21 wherein the means for applying the envelope to the signal output from the sigma-delta modulator comprises a multiplier.

23. The apparatus of claim 21 wherein the means for adaptively adjusting the dynamic range of a signal output from the sigma-delta modulator further comprises means for adjusting an amplitude of the envelope.

24. The apparatus of claim 21 wherein the means for adaptively adjusting the dynamic range of a signal output from the sigma-delta modulator further comprises means for reconstructing the signal input to the sigma-delta modulator, and wherein the means for generating an envelope of a signal input to the sigma-delta modulator is configured to generate said envelope from the reconstructed signal.

25. The apparatus of claim 24 wherein the means for generating an envelope of a signal input to the sigma-delta modulator comprises means for rectifying the reconstructed signal.

26. The apparatus of claim 25 wherein the means for generating an envelope of a signal input to the sigma-delta modulator further comprises means for filtering the rectified reconstructed signal.

27. The apparatus of claim 24 wherein the means for reconstructing the signal input to the sigma-delta modulator is configured to reconstruct the signal input to the sigma-delta modulator from the feedback signal.

28. The apparatus of claim 27 wherein the means for reconstructing the signal input to the sigma-delta modulator comprises means for filtering the feedback signal.

29. The apparatus of claim 21 wherein the sigma-delta modulator comprises a feedback loop, and wherein the means for adaptively adjusting the dynamic range of a signal output from the sigma-delta modulator is configured to provide feedback signal to the feedback loop in the sigma-delta modulator.

30. An apparatus configured to receive a signal output from a sigma-delta modulator, the apparatus comprising:
means for processing the received signal to adaptively adjust the dynamic range of the received signal, such that the dynamic range is adjusted directly proportional to an instantaneous amplitude of a signal input to the sigma-delta modulator, and to produce an output signal comprising the received signal with its dynamic range adjusted; and
means for filtering the output signal.

31. The apparatus of claim 30 wherein the means for processing the received signal further comprises means for generating an envelope of the output signal and means for applying the envelope to the received signal.

32. The apparatus of claim 31 wherein the means for applying the envelope to the received signal comprises a multiplier.

33. The apparatus of claim 31 wherein the means for processing the received signal further comprises means for adjusting an amplitude of the envelope.

34. The apparatus of claim 31 wherein the means for processing the received signal further comprises means for reconstructing the signal input to the sigma-delta modulator, and wherein the means for generating an envelope of a signal input to the sigma-delta modulator is configured to generate said envelope from the reconstructed signal.

35. The apparatus of claim 34 wherein the means for generating an envelope of a signal input to the sigma-delta modulator comprises means for rectifying the reconstructed signal.

36. The apparatus of claim 35 wherein the means for generating an envelope of a signal input to the sigma-delta modulator further comprises means for filtering the rectified reconstructed signal.

37. The apparatus of claim 34 wherein the means for reconstructing the signal input to the sigma-delta modulator is configured to reconstruct the signal input to the sigma-delta modulator from the received signal.

38. The apparatus of claim 34 wherein the means for reconstructing the signal input to the sigma-delta modulator comprises means for filtering the received signal.

39. A method for processing signals, comprising:
passing a signal through a sigma-delta modulator; and
adaptively adjusting the dynamic range of the signal output from the sigma-delta modulator, such that the dynamic range is adjusted inversely proportional to an instantaneous amplitude of a signal input to the sigma-delta modulator.

40. The method of claim 39 wherein the adaptive adjusting of the dynamic range of a signal output from the sigma-delta modulator comprises generating an envelope of the signal input to the sigma-delta modulator, and applying the envelope to the signal output from the sigma-delta modulator to generate a feedback signal for the sigma-delta modulator.

41. The method of claim 40 wherein the applying of the envelope to the signal output from the sigma-delta modulator comprises multiplying the envelope with the signal output from the sigma-delta modulator.

42. The method of claim 40 wherein the adaptive adjusting of the dynamic range of a signal output from the sigma-delta modulator further comprises adjusting an amplitude of the envelope.

43. The method of claim 40 wherein the adaptive adjusting of the dynamic range of a signal output from the sigma-delta modulator comprises reconstructing the signal input to the sigma-delta modulator, and wherein the envelope of a signal input to the sigma-delta modulator is generated from the reconstructed signal.

44. The method of claim 43 wherein the generating of an envelope of a signal input to the sigma-delta modulator comprises rectifying the reconstructed signal.

45. The method of claim 44 wherein the generating of an envelope of a signal input to the sigma-delta modulator further comprises filtering the rectified reconstructed signal.

46. The method of claim 43 wherein the signal input to the sigma-delta modulator is reconstructed from the feedback signal.

47. The method of claim 46 wherein the reconstructing of the signal input to the sigma-delta modulator comprises filtering the feedback signal.

48. The method of claim 40 wherein the sigma-delta modulator comprises a feedback loop, and wherein the adaptive adjusting of the dynamic range of a signal output from the sigma-delta modulator comprising provide the feedback signal to the feedback loop in the sigma-delta modulator.

49. A method to process a signal received from an output of a sigma-delta modulator, the method comprising:
processing the received signal to adaptively adjust the dynamic range of the received signal, such that the dynamic range is adjusted directly proportional to an instantaneous amplitude of a signal input to the sigma-delta modulator, and to produce an output signal comprising the received signal with its dynamic range adjusted; and
filtering the output signal.

50. The method of claim 49 wherein the processing of the received signal comprises generating an envelope of the output signal, and applying the envelope to the received signal.

51. The method of claim 50 wherein the applying of the envelope to the received signal comprises multiplying the envelope with the received signal.

52. The method of claim 50 wherein the processing of the received signal further comprises adjusting an amplitude of the envelope.

53. The method of claim 50 wherein the processing of the received signal further comprises reconstructing the signal input to the sigma-delta modulator, and wherein the envelope is generated from the reconstructed signal.

54. The method of claim 53 wherein the generating of an envelope of a signal input to the sigma-delta modulator comprises rectifying the reconstructed signal.

55. The method of claim 54 wherein the generating of an envelope of a signal input to the sigma-delta modulator further comprises filtering the rectified reconstructed signal.

56. The method of claim 53 wherein the signal input to the sigma-delta modulator is reconstructed from the received signal.

57. The method of claim 53 wherein the reconstructing of the signal input to the sigma-delta modulator comprises filtering the received signal.

58. A computer-program product for processing signals, comprising:
a machine-readable medium comprising instructions executable by a processing system, the instructions comprising code for:
passing a signal from a sigma-delta modulator; and
adaptively adjusting the dynamic range of the signal output from the sigma-delta modulator, such that the dynamic range is adjusted inversely proportional to an instantaneous amplitude of a signal input to the sigma-delta modulator.

59. A computer-program product for processing signals, comprising:
a machine-readable medium comprising instructions executable by a processing system configured to receive a signal output from a sigma-delta modulator, the instructions comprising code for:
processing the received signal to adaptively adjust the dynamic range of the received signal, such that the dynamic range is adjusted directly proportional to an instantaneous amplitude of a signal input to the sigma-delta modulator, and to produce an output signal comprising the received signal with its dynamic range adjusted; and
filtering the output signal.

60. An apparatus for processing signals, comprising:
a filter configured to receive an input signal and a scaled signal and to generate a filtered signal;
a quantizer configured to generate a quantized signal based on the filtered signal; and
an adaptive dynamic range controller configured to generate the scaled signal based on the quantized signal, such that the dynamic range of the quantized signal is adjusted inversely proportional to an instantaneous amplitude of the input signal.

61. The apparatus of claim 60 wherein the adaptive dynamic range controller further comprises an envelope detector configured to generate an envelope signal, and a multiplier configured to multiply the quantized signal with the envelope signal to generate the scaled signal.

62. The apparatus of claim 61 wherein the adaptive dynamic range controller further comprises a variable gain amplifier configured to adjust an amplitude of the envelope signal.

63. The apparatus of claim 61 wherein the adaptive dynamic range controller further comprises a signal reconstruction unit configured to receive the scaled signal and generate an output, said envelope detector being further configured to generate the envelope signal based on the output from the signal reconstruction unit.

64. The apparatus of claim 63 wherein the envelope detector further comprises a rectifier configured to rectify the output from the signal reconstruction unit.

65. The apparatus of claim 64 wherein the envelope detector further comprises a filter, and wherein the rectifier is further configured to provide the rectified output from the signal reconstruction unit to the filter.

66. The apparatus of claim 63 wherein the signal reconstruction unit comprises a filter configured to filter the scaled signal.

67. An apparatus configured to receive a signal output from a sigma-delta modulator, the apparatus comprising:
an adaptive dynamic range controller configured to receive the signal from the sigma-delta modulator to adaptively adjust the dynamic range of the received signal, such that the dynamic range is adjusted directly proportional to an instantaneous amplitude of a signal input to the sigma-delta modulator, and to generate a scaled signal comprising the received signal with its dynamic range adjusted; and
a filter configured to receive the scaled signal.

68. The apparatus of claim 67 wherein the adaptive dynamic range controller further comprises an envelope detector configured to generate an envelope signal, and a multiplier configured to multiply the envelope signal with the received signal from the sigma-delta modulator to generate the scaled signal.

69. The apparatus of claim 68 wherein the adaptive dynamic range controller further comprises a variable gain amplifier configured to adjust an amplitude of the envelope signal.

70. The apparatus of claim 68 wherein the adaptive dynamic range controller further comprises a signal reconstruction unit configured to receive the scaled signal and generate an output, said envelope detector being further configured to generate the envelope signal based on the output of the signal reconstruction unit.

71. The apparatus of claim 70 wherein the envelope detector further comprises a rectifier configured to rectify the output from the signal reconstruction unit.

72. The apparatus of claim 71 wherein the envelope detector further comprises a filter, wherein the rectifier is further configured to provide the rectified output from the signal reconstruction unit to the filter.

73. The apparatus of claim 70 wherein the signal reconstruction unit comprises a filter configured to filter the scaled signal.

74. An apparatus for processing signals, comprising:
means for filtering an input signal based on a scaled signal to generate a filtered signal;
means for generating a quantized signal based on the filtered signal; and
means for generating the scaled signal based on the quantized signal, such that the dynamic range of the quantized signal is adjusted inversely proportional to an instantaneous amplitude of the input signal.

75. The apparatus of claim 74 wherein the means for generating the scaled signal comprises means for generating an envelope signal and means for applying the envelope signal to the quantized signal to generate the scaled signal.

76. The apparatus of claim 75 wherein the means for generating the scaled signal further comprises means for adjusting an amplitude of the envelope signal.

77. The apparatus of claim 75 wherein the means for generating the scaled signal further comprises means for reconstructing the input signal from the scaled signal, said means for generating an envelope signal being configured to generate the envelope signal based on the reconstructed input signal.

78. The apparatus of claim 77 wherein the means for generating the envelope signal comprises means for rectifying the reconstructed input signal.

79. The apparatus of claim 78 wherein the means for generating the envelope further comprises means for filtering the rectified reconstructed input signal.

80. The apparatus of claim 77 wherein the means for reconstructing the input signal comprises means for filtering the scaled signal.

81. An apparatus configured to receive a signal output from a sigma-delta modulator, the apparatus comprising:
means for adaptively adjusting the dynamic range of the received signal, such that the dynamic range is adjusted directly proportional to an instantaneous amplitude of a signal input to the sigma-delta modulator;
means for generating a scaled signal based on the received signal with its dynamic range adjusted; and
means for filtering the scaled signal.

82. The apparatus of claim 81 wherein the means for filtering the scaled signal comprises means for generating an envelope signal and means for applying the envelope signal to the received signal from the sigma-delta modulator to generate the scaled signal.

83. The apparatus of claim 82 wherein the means for filtering the scaled signal further comprises means for adjusting an amplitude of the envelope signal.

84. The apparatus of claim 82 wherein the means for filtering the scaled signal further comprises means for reconstructing a signal input to the sigma-delta modulator, said envelope detector being configured to generate the envelope signal based on the reconstructed signal input.

85. The apparatus of claim 84 wherein the means for generating an envelope comprises means for rectifying the reconstructed signal input.

86. The apparatus of claim 85 wherein the means for generating an envelope further comprises means for filtering the rectified reconstructed signal input.

87. The apparatus of claim 84 wherein the means for reconstructing a signal input to the sigma-delta modulator comprises means for filtering the scaled signal.

88. A method for processing signals, comprising:
filtering an input signal based on a scaled signal to generate a filtered signal;
generating a quantized signal based on the filtered signal; and
generating the scaled signal based on the quantized signal, such that the dynamic range of the quantized signal is adjusted inversely proportional to an instantaneous amplitude of the input signal.

89. The method of claim 88 wherein the generating of the scaled signal comprises generating an envelope signal and applying the envelope signal to the quantized signal to generate the scaled signal.

90. The method of claim 89 wherein the generating of the scaled signal further comprises adjusting an amplitude of the envelope signal.

91. The method of claim 89 wherein the generating of the scaled signal further comprises reconstructing the input signal from the scaled signal, and wherein the generating of the envelope signal is based on the reconstructed input signal.

92. The method of claim 91 wherein the generating of the envelope signal comprises rectifying the reconstructed input signal.

93. The method of claim 92 wherein the generating of the envelope further comprises filtering the rectified reconstructed input signal.

94. The method of claim 91 wherein the reconstructing of the input signal comprises filtering the scaled signal.

95. A method for processing a signal received from an output of a sigma-delta modulator, the method comprising:
adaptively adjusting the dynamic range of the received signal, such that the dynamic range is adjusted directly proportional to an instantaneous amplitude of a signal input to the sigma-delta modulator;
generating a scaled signal based on the received signal with its dynamic range adjusted; and
filtering the scaled signal.

96. The method of claim 95 wherein the filtering of the scaled signal comprises generating an envelope signal and applying the envelope signal to the received signal from the sigma-delta modulator to generate the scaled signal.

97. The method of claim 96 wherein the filtering of the scaled signal further comprises adjusting an amplitude of the envelope signal.

98. The method of claim 96 wherein the filtering of the scaled signal further comprises reconstructing a signal input to the sigma-delta modulator, and wherein the generating of the envelope signal is based on the reconstructed input signal.

99. The method of claim 98 wherein the generating of an envelope comprises rectifying the reconstructed signal input.

100. The method of claim 99 wherein the generating of an envelope further comprises filtering the rectified reconstructed signal input.

101. The method of claim 98 wherein the reconstructing of a signal input to the sigma-delta modulator comprises filtering the scaled signal.

102. A computer-program product for processing signals, comprising:
a machine-readable medium comprising instructions executable by a processing system, the instructions comprising code for:
filtering an input signal based on a scaled signal to generate a filtered signal;
generating a quantized signal based on the filtered signal; and
generating the scaled signal based on the quantized signal, such that the dynamic range of the quantized signal is adjusted inversely proportional to an instantaneous amplitude of the input signal.

103. A computer-program product for processing signals, comprising:
a machine-readable medium comprising instructions executable by a processing system configured to receive a signal output from a sigma-delta modulator, the instructions comprising code for:
adaptively adjusting the dynamic range of the received signal, such that the dynamic range is adjusted directly proportional to an instantaneous amplitude of a signal input to the sigma-delta modulator;
generating a scaled signal based on the received signal with its dynamic range adjusted; and
filtering the scaled signal.

104. A headset, comprising:
a signal source configured to generate a signal;
a sigma-delta modulator configured to receive the signal from the signal source and produce an output; and
an adaptive dynamic range controller configured to adaptively adjust the dynamic range of the output from the sigma-delta modulator, such that the dynamic range is adjusted inversely proportional to an instantaneous amplitude of a signal input to the sigma-delta modulator.

105. A headset configured to receive a signal output from a sigma-delta modulator, the handset comprising:
a signal load;
an adaptive dynamic range controller configured to adaptively adjust the dynamic range of the received signal, such that the dynamic range is adjusted directly proportional to an instantaneous amplitude of a signal input to the sigma-delta modulator, and to produce an output signal comprising the received signal with its dynamic range adjusted; and
a filter configured to filter the output signal from the adaptive dynamic range controller and, to provide the filtered output signal to the signal load.

106. A headset, comprising:
a signal source configured to generate a signal;
a filter configured to receive the signal from the signal source and a scaled signal and to generate a filtered signal;
a quantizer configured to generate a quantized signal based on the filtered signal; and
an adaptive dynamic range controller configured to generate the scaled signal based on the quantized signal, such that the dynamic range of the quantized signal is adjusted inversely proportional to an instantaneous amplitude of the signal received form the signal source.

107. A headset configured to receive a signal output from a sigma-delta modulator, the handset comprising:
an adaptive dynamic range controller configured to receive the signal from the sigma-delta modulators adaptively adjust the dynamic range of the received signal, such that the dynamic range is adjusted directly proportional to an instantaneous amplitude of a signal input to the sigma-delta modulator, and to and generate a scaled signal based on the received signal with its dynamic range adjusted;
a filter configured to receive the scaled signal and generate a filtered signal; and
a signal load configured to receive the filtered signal.

* * * * *